United States Patent
Normand et al.

(10) Patent No.: US 11,164,862 B2
(45) Date of Patent: Nov. 2, 2021

(54) DISTRIBUTED RC TERMINATION

(71) Applicant: Murata Manufacturing Co., Ltd., Nagaokakyo (JP)

(72) Inventors: Nicolas Normand, Herouville Saint Clair (FR); Stéphane Bouvier, Cairon (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/745,798

(22) Filed: Jan. 17, 2020

(65) Prior Publication Data

US 2020/0152625 A1 May 14, 2020

Related U.S. Application Data

(63) Continuation of application No. PCT/IB2018/000742, filed on Jul. 16, 2018.

(30) Foreign Application Priority Data

Jul. 17, 2017 (EP) .................... 17305946

(51) Int. Cl.
*H01L 27/07* (2006.01)
*H01L 27/06* (2006.01)
(Continued)

(52) U.S. Cl.
CPC ...... *H01L 27/0794* (2013.01); *H01L 27/0682* (2013.01); *H01L 28/24* (2013.01);
(Continued)

(58) Field of Classification Search
None
See application file for complete search history.

(56) References Cited

U.S. PATENT DOCUMENTS

| 4,821,007 A | 4/1989 | Fields et al. |
| 2002/0020879 A1 | 2/2002 | Shiiki et al. |

(Continued)

FOREIGN PATENT DOCUMENTS

| EP | 0 700 091 A2 | 3/1996 |
| EP | 0 700 091 A3 | 5/1997 |

OTHER PUBLICATIONS

International Search Report issued for PCT/IB2018/000742, dated Oct. 17, 2018.
(Continued)

*Primary Examiner* — Steven M Christopher
(74) *Attorney, Agent, or Firm* — Arent Fox LLP

(57) ABSTRACT

An integrated resistor-capacitor (RC) structure (400) is disclosed. The integrated RC structure includes a vertical capacitor (302,402,306) and a resistive element (308,310) disposed above the capacitor. The integrated RC structure uses a low ohmic substrate (302) to ensure a good ground return path for the capacitor. Further, a resistivity of the substrate is configured such that a top plate (306) of the capacitor provides a reference ground above a predefined frequency. The impedance of the resistive element (308,310) is matched, relative to the reference ground, to a predetermined resistance. As such, the resistance of the resistive element (308,310) can be controlled to provide an impedance controlled RC structure over a range of operating frequencies.

15 Claims, 2 Drawing Sheets

(51) Int. Cl.
*H01L 49/02* (2006.01)
*H01L 29/66* (2006.01)
*H01L 29/94* (2006.01)

(52) U.S. Cl.
CPC ........ *H01L 28/40* (2013.01); *H01L 29/66181* (2013.01); *H01L 29/945* (2013.01)

(56) References Cited

U.S. PATENT DOCUMENTS

| | | | | |
|---|---|---|---|---|
| 2009/0194845 | A1* | 8/2009 | Werner | H01L 27/10852 |
| | | | | 257/532 |
| 2014/0197518 | A1* | 7/2014 | Maiorana | H01L 29/94 |
| | | | | 257/532 |
| 2018/0012932 | A1* | 1/2018 | Oliver | H01L 39/04 |
| 2018/0114720 | A1* | 4/2018 | Wang | H01L 27/1203 |

OTHER PUBLICATIONS

Written Opinion of the International Searching Authority issue for PCT/IB2018/000742, dated Oct. 17, 2018.

* cited by examiner

DISTRIBUTED RC TERMINATION

CROSS REFERENCE TO RELATED APPLICATIONS

The present application is a continuation of International application No. PCT/IB2018/000742, filed Jul. 16, 2018, which claims priority to European Patent Application No. 17305946.0, filed Jul. 17, 2017, the entire contents of each of which are incorporated herein by reference.

FIELD OF THE INVENTION

The present invention relates to integrated structures including resistive and capacitive elements.

BACKGROUND OF THE INVENTION

In various applications, for example in radio-frequency (RF) applications such as optical transceivers or RF power amplifiers, passive elements such as resistors and capacitors are often required. As the operating bandwidth continues to increase for these applications, reaching up to several GHz in some cases, it is desirable to control the behavior of the passive elements. Specifically, it is desirable to manage bandwidth limitations due to the passive elements to ensure a substantially constant frequency response of the passive elements over the entire operating bandwidth.

For example, a decoupling capacitor and a damping resistor are often used to provide signal termination in RF applications. Conventionally, these two components are implemented as separate devices on separate substrates due to antagonistic requirements for substrate properties. To ensure a wide bandwidth resistor, for example a resistor having a stable impedance value from D.C. up into the gigahertz range, a high-ohmic substrate is typically needed to reduce parasitic impedance forming through the substrate. In contrast, a low-ohmic substrate is needed to facilitate a good ground return path for the decoupling capacitor.

While providing separate substrates for the capacitor and the resistor can ensure stable performance for each component, the implementation requires more circuit area, a large number of interconnections, and a prolonged fabrication process.

SUMMARY OF THE INVENTION

The present invention provides a semiconductor device that integrates a capacitor and a resistive element in the same die. In an embodiment, the capacitor provides a decoupling capacitor and the resistive element provides a broadband damping resistor. Despite using a low resistivity substrate (which accommodates design considerations of the capacitor but not the resistive element), a substantially constant resistance for the resistive element can be maintained over a wide bandwidth. The low resistivity substrate ensures a good ground return path for the capacitor. With the semiconductor device configured to have a substantially constant impedance over a wide bandwidth, the device can be highly suited for use in impedance controlled circuits, such as termination circuits, for example.

More specifically, a first aspect of the present invention provides a semiconductor device, comprising:

a substrate;

a first dielectric layer disposed above the substrate;

a conductive layer disposed above the first dielectric layer;

a second dielectric layer disposed above the conductive layer; and a resistive layer disposed above the second dielectric layer, wherein the substrate, the first dielectric layer and the conductive layer form a vertical capacitor, wherein the second dielectric layer and the resistive layer form a resistive element, wherein a resistivity of the substrate is configured such that the conductive layer provides a reference ground above a predefined frequency, and wherein the second dielectric layer and the resistive layer are configured such that the resistive element is impedance matched, relative to the reference ground, to a predetermined resistance.

Typically, the substrate is configured to have low resistivity. In an embodiment, the resistivity of the substrate is lower than or equal to 1 mOhms·cm. In an implementation, the substrate is implemented to contain doped material. In another embodiment, a thickness of the substrate is lower than or equal to 100 micrometers. The low resistivity of the substrate allows the capacitor to have a good ground return path making the capacitor highly suited as a decoupling capacitor. In another embodiment, the capacitor is further configured to have very low parasitic components (i.e., very low Equivalent Series Resistance (ESR) and Equivalent Series Inductance (ESL)), thereby also having low impedance at low and high frequency.

In some embodiments, the first dielectric layer is planar or deposited into a trench etched into the substrate. The trench implementation allows to augment a surface area of the vertical capacitor, thereby increasing its capacitance. In an embodiment, the vertical capacitor is formed using Passive Integrated Common Substrate (PICS®) technology. In a particular embodiment, the capacitance per unit area of the vertical capacitor is preferably higher than 6 $nF/mm^2$.

In some embodiments, a thickness of the second dielectric layer is between 0.2 and 0.3 micrometers.

In some embodiments, a sheet resistance of the resistive layer is between 10 mOhms per square to 20 Ohms per square. In one embodiment, the resistive layer corresponds to a metallization layer made of alumina. This embodiment is suited for applications requiring a resistance of the resistive element of approximately 0.5 Ohms over 1 GHz. In another embodiment, the targeted resistance of the resistive element is approximately 50 Ohms, in which case the resistive layer may be made of tantalum nitride.

According to some embodiments, the second dielectric layer and the resistive layer (i.e., the resistive element) form a transmission line. The second dielectric layer and the resistive layer can be configured to provide a microstrip transmission line, wherein the resistive layer is disposed on top of the second dielectric layer. In another embodiment, material forming a first auxiliary ground plane is disposed to surround one or more sides of the resistive layer, thereby the second dielectric layer, the first auxiliary ground plane and the resistive layer form a grounded coplanar transmission line. In a further embodiment, material forming a first auxiliary ground plane is disposed to surround one or more sides of the resistive layer and material forming a second auxiliary ground plane is disposed over a top surface of the resistive layer, thereby the second dielectric layer, the material forming the first and second auxiliary ground planes, and the resistive layer form a stripline transmission line.

In some embodiments, the impedance of the transmission line is configured to remain substantially constant over a predetermined frequency band. This configuration may involve configuring several properties of the transmission line, including the transmission line configuration (microstrip, coplanar, or stripline), the materials used for the second dielectric layer and the resistive layer, the shape and thickness of the resistive layer and/or the second dielectric layer, etc.

Correlatively, according to a second aspect the present invention provides a method for fabricating a semiconductor device, comprising:

provid a substrate;

forming a first dielectric layer above the substrate;

forming a conductive layer above the first dielectric layer;

forming a second dielectric layer above the conductive layer; and forming a resistive layer above the second dielectric layer, wherein the second dielectric layer and the resistive layer form a resistive element, wherein providing the substrate comprises configuring a resistivity of the substrate such that the conductive layer provides a reference ground above a predefined frequency, and wherein forming the second dielectric layer and the resistive layer comprises configuring the second dielectric layer and the resistive layer such that the resistive element is impedance matched, relative to the reference ground, to a predetermined resistance.

BRIEF DESCRIPTION OF THE DRAWINGS

The accompanying drawings illustrate certain embodiments of the present invention and, together with the description, serve to inform a person skilled in the art regarding how to put the invention into effect.

The present disclosure will be described with reference to the accompanying drawings. Generally, the drawing in which an element first appears is typically indicated by the leftmost digit(s) in the corresponding reference number.

DETAILED DESCRIPTION OF THE PREFERRED EMBODIMENTS

Figure 1:
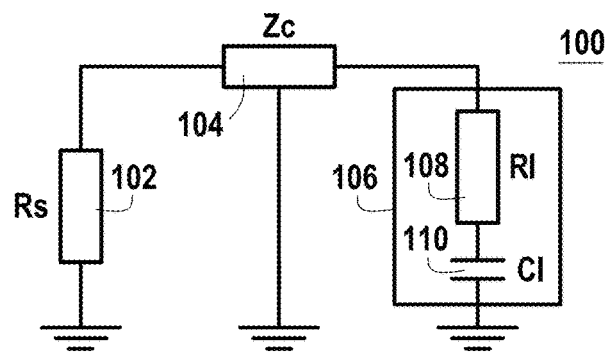
FIG. 1 illustrates a simplified circuit diagram of a radio-frequency (RF) transmission system.

FIG. 1 illustrates a simplified circuit diagram of a radio-frequency (RF) transmission system 100. RF transmission system 100 may be a RF power transmitter or power amplifier for example. Alternatively, RF transmission system 100 may be an input stage of an optical transceiver. As shown in FIG. 1, RF transmission system 100 has a source resistance 102, a transmission line 104 having a characteristic impedance Zc, and a resistor-capacitor (RC) circuit 106. RC circuit 106 includes a resistor 108 and a capacitor 110.

In an embodiment, where RF transmission system 100 is an RF power transmitter using envelope injection, RC circuit 106 provides an envelope termination circuit with capacitor 110 acting as a decoupling capacitor and resistor 108 acting as a damping resistor. In this case, RC circuit 106 may provide low resistive termination (below 1 Ohms) to eliminate LC-induced spikes and oscillation. In another embodiment, where RF transmission system 100 is used in an optical transceiver, RC circuit 106 may provide adapted termination (around 50 Ohms) to match a 50 Ohms transmission line.

In one embodiment, RF transmission system 100 is treated like a matched impedance line with a source impedance, a characteristic impedance, and a load impedance. RC circuit 106 is treated as the load of the matched impedance line. Impedance matching is performed by ensuring that the source impedance, the characteristic impedance of the transmission line, and the load impedance are equal. This ensures both maximum power transfer from the source to the load and reduces power reflection from the load.

In an embodiment, to ensure a high decoupling performance of capacitor 110, capacitor 110 is designed to have very low parasitic components (i.e., very low Equivalent Series Resistance (ESR) and Equivalent Series Inductance (ESL)) at both low and high frequency thereby ensuring that capacitor 110 has a low impedance across the operating frequency band. Furthermore, to ensure a good ground return path for capacitor 110, a low ohmic substrate is used.

As noted above, the low ohmic substrate used for capacitor performance is typically incompatible with the wideband performance requirement for resistor 108. This is because a low ohmic substrate typically increases the parasitic impedance through the substrate, resulting in a frequency variable effective resistance for resistor 108. In an embodiment, to realize a substantially constant effective resistance over a wide frequency range, resistor parasitics are controlled. In the integration, resistor 108 is laid directly on top of capacitor 110. In addition, resistor 108 is designed like a transmission line that is tuned based on a reference ground provided by the top plate of capacitor 110. This is because, with the above described capacitor design choices, capacitor 110 behaves as a wideband shunt to ground at higher frequencies.

In an embodiment, parasitics due to resistor 108 (inductive and capacitive parasitics) are distributed over the top plate capacitor so that the AC impedance of resistor 108 equals its DC resistance.

Figure 2:
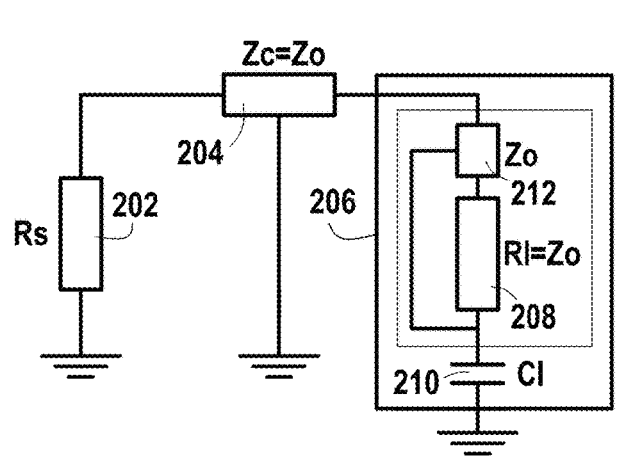
FIG. 2 illustrates a simplified circuit diagram of an RF transmission system according to an embodiment.

The concept of treating the resistor as a transmission line is further illustrated in FIG. 2, which shows a simplified circuit diagram of an RF transmission system 200 according to an embodiment. RF transmission system 200 has a source resistance 202, a transmission line 204 having a characteristic impedance Zc equal to a DC resistance Z0, and an RC circuit 206. RC circuit 206 includes a resistor 208 having a DC resistance equal to Z0 and a capacitor 210. As shown, because capacitor 210 is designed to behave as a wideband shunt to ground, RC circuit 206 can be represented as a transmission line 212 having a DC resistance Z0 coupled to a reference ground provided by capacitor 210.

Example implementations of embodiments are now described. These implementations are provided for the purpose of illustration only and are not limiting.

Figure 3:
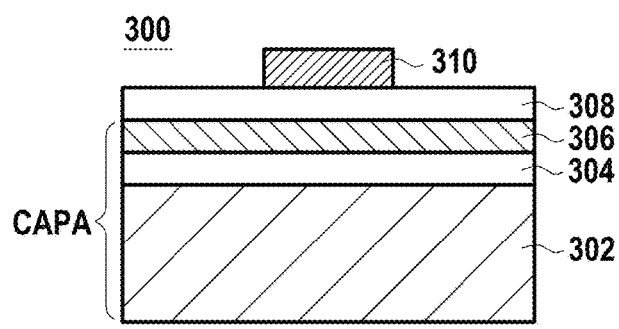
FIG. 3 illustrates a cross-section of a resistor-capacitor (RC) structure according to an embodiment.

FIG. 3 illustrates a cross-section of an RC structure 300 according to an embodiment. In an embodiment, RC structure 300 forms an envelope termination circuit used in an RF power transmitter utilizing envelope injection. In an embodiment, RC structure 300 provides a decoupling capacitor and a broadband damping resistor.

As shown in FIG. 3, RC structure 300 includes a substrate 302, a first dielectric layer 304 disposed above substrate 302; a conductive layer 306 disposed above first dielectric layer 304; a second dielectric layer 308 disposed above conductive layer 306; and a resistive layer 310 disposed above second dielectric layer 308.

Substrate 302, first dielectric layer 304, and conductive layer 306 form a vertical capacitor, with conductive layer 306 providing the top capacitor plate and substrate 302 providing the bottom capacitor plate.

In one embodiment, the vertical capacitor is configured to have very low parasitics (i.e., low ESR and ESL) and high capacitance. In a particular embodiment, the capacitance per unit area of the vertical capacitor is preferably higher than 6 nF/mm$^2$. In one implementation, the vertical capacitor may be formed using Passive Integrated Common Substrate (PICS®) technology.

To ensure a good ground return path for the vertical capacitor, substrate 302 is configured to be a low ohmic substrate. In embodiments, the resistivity of substrate 302 is configured such that conductive layer 306 provides a reference ground above a predefined frequency. In certain embodiments, the resistivity of substrate 302 is lower than or equal to 1 mOhms·cm. To achieve the low resistivity, in some embodiments, substrate 302 contains doped material. Alternatively or additionally, substrate 302 may have a thickness that is lower than or equal to 100 micrometers. In embodiments, substrate 302 can be made of a silicon material, N type or P type doped, with gallium, gallium arsenide, gallium nitride, etc.

Figure 4:
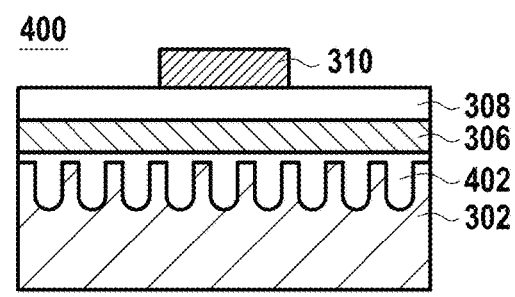
FIG. 4 illustrates a cross-section of another RC structure according to an embodiment.

First dielectric layer 304 can be made of silicon oxide, but other materials may be used such as, for example, nitride, alumina nitride, etc. In an embodiment, first dielectric layer 304 includes a combination of layers made from one or more of the described materials. First dielectric layer 304 can be planar as shown in FIG. 3. Alternatively, as shown in FIG. 4, first dielectric layer 304 can be deposited into one or more three dimensional trenches etched into substrate 302. The trench implementation allows to augment a surface area of the vertical capacitor, thereby further increasing its capacitance.

Conductive layer 306 can be made of alumina, but other materials may be used such as, for example, alumina alloy, titanium, platinum, copper, etc. As noted above, conductive layer 306 provides the top plate of the vertical capacitor. Above a predefined frequency, conductive layer 306 provides a reference ground that is used to tune the resistive element as described below.

Second dielectric layer 308 and resistive layer 310 form a resistive element. Second dielectric layer 308 can be made of Silicon oxide, nitride, polyimide, etc. In some embodiments, for example in embodiments where the target resistance of the resistive element over the operating frequency range is 0.5 Ohms, a thickness of second dielectric layer 308 may be between 0.2 and 0.3 micrometers In an embodiment, second dielectric layer 308 and resistive layer 310 are configured such that the resistive element is impedance matched, relative to the reference ground provided by conductive layer 306, to a predetermined resistance. In an embodiment, the predetermined resistance corresponds to the load resistance targeted by the application (e.g., 0.5 Ohms, 50 Ohms, etc.).

In embodiments, a sheet resistance of resistive layer 310 is between 10 mOhms per square to 20 Ohms per square. In one embodiment, suited for applications requiring a resistance of the resistive element of approximately 0.5 Ohms over 1 GHz, resistive layer 310 is provided in the form of a metallization layer made of alumina but other materials may be used such as, for example, titanium, platinum, copper, etc. In another embodiment, resistive layer 310 is made of tantalum, though other materials may also be used such as, for example, tantalum nitride, tungsten, or a combination of both. This embodiment is suitable for applications targeting a resistance of approximately 50 Ohms for the resistive element.

Figure 5:
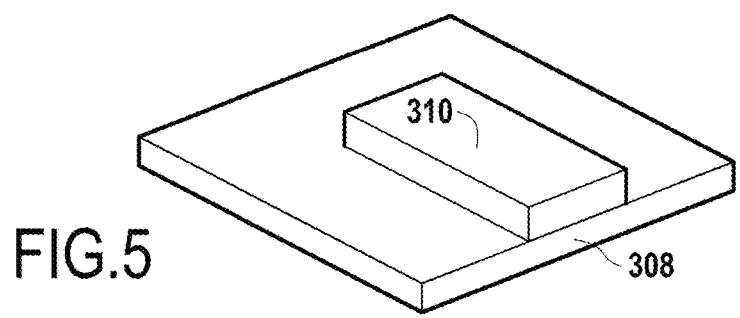
FIG. 5 is a three-dimensional view of a portion of the RC structure illustrated in FIG. 3 or FIG. 4.

As noted above, according to embodiments, second dielectric layer 308 and resistive layer 310 form a transmission line. Depending on the application, different transmission line configurations can be used. For example, second dielectric layer 308 and resistive layer 310 can be configured, as shown in FIGS. 3, 4, and 5 to provide a microstrip transmission line. In this configuration, resistive layer 310 is entirely disposed above second dielectric layer 308. This configuration presents the advantage that it is easy to implement. However, because second dielectric layer 308 is in direct contact with the air, it may be sensitive to external electromagnetic perturbation.

Figure 6:
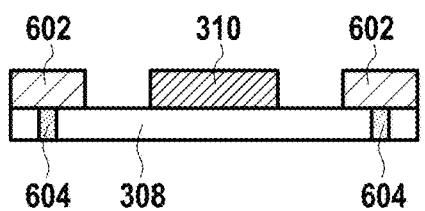
FIG. 6 illustrates a cross-section of a portion of another RC structure according to an embodiment.
Figure 7:
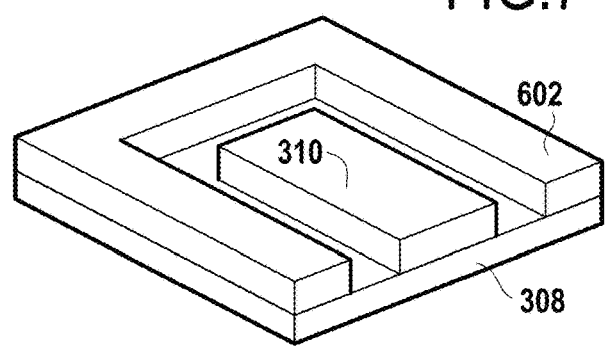
FIG. 7 is a three-dimensional view of the RC structure portion illustrated in FIG. 6.

In another embodiment, shown in a cross-sectional view and a three-dimensional view in FIGS. 6 and 7 respectively, material forming a first auxiliary ground plane 602 is disposed to surround one or more sides of resistive layer 310. Vias 604 are formed through second dielectric layer 308 to connect first auxiliary ground plane 602 to conductive layer 306. A grounded coplanar transmission line is thus formed. A coplanar transmission line configuration may be useful in embodiments requiring a lower impedance (e.g., in the range of 0.5 Ohms) as, generally, the impedance can be reduced further using this configuration than using a microstrip configuration, for example. The material forming the first auxiliary ground plane may be made of alumina or copper.

Figure 8:
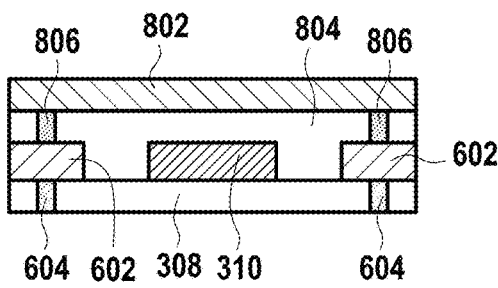
FIG. 8 illustrates a cross-section of a portion of another RC structure according to an embodiment.
Figure 9:
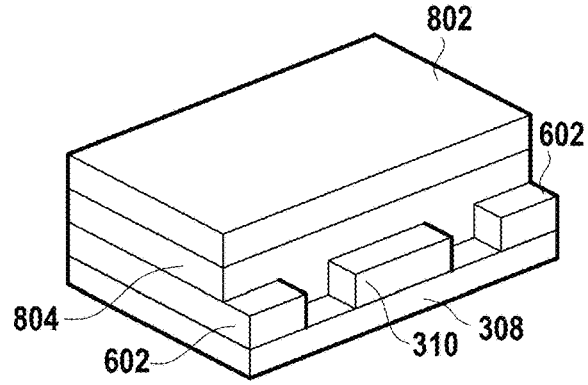
FIG. 9 is a three-dimensional view of the RC structure portion illustrated in FIG. 8.

In a further embodiment, shown in a cross-sectional view and a three-dimensional view in FIGS. 8 and 9 respectively, material forming a second auxiliary ground plane 802 is disposed above resistive layer 310, in addition to the material 602 forming the first auxiliary ground plane. Specifically, an oxide layer 804 is disposed on top of first auxiliary ground plane 602 and resistive layer 310, and second auxiliary ground plane 802 is disposed on top of oxide layer 804. Vias 806 are formed through oxide layer 804 to connect second auxiliary ground plane 802 to first auxiliary ground plane 602. First auxiliary ground plane 602, as in the coplanar transmission line configuration, is connected to conductive layer 306 using vias 604. A stripline transmission line is thus formed. One advantage of this configuration is that resistive layer 310 can be better protected from external electromagnetic perturbation. The material forming the second auxiliary ground plane may be made of alumina or copper.

In embodiments, the impedance of the transmission line is configured to remain substantially constant over a predetermined frequency band. This configuration may be performed by appropriately setting one or more properties of the transmission line, for example: the transmission line configuration (microstrip, coplanar, or stripline), the materials used for second dielectric layer 308 and resistive layer 310, the shape and thickness of resistive layer 310 and/or second dielectric layer 308, etc.

For instance, resistive and inductive components of the transmission line may be controlled by appropriate setting of the dimensions and electrical properties of resistive layer 310 and second dielectric layer 308 as well as the positioning of resistive layer 310 relative to the reference ground/auxiliary ground planes. For example, in an embodiment, the thickness of second dielectric layer 308 may be selected, and the dimensions, resistivity, and permittivity of resistive layer 310 may be set based on the thickness of second dielectric layer 308. In an embodiment, the thicker second dielectric layer 308 is, the more appropriate it is to narrow the width of resistive layer 310 to maintain the impedance of the transmission line constant and equal to the DC resistance value thereof.

As an example, in order to obtain an impedance which remains substantially equal to 0.5 Ohms over a range of operating frequencies from D.C. up into the gigahertz range, the following example configuration (in a microstrip configuration) may be used. The low frequency part of the impedance (e.g., DC resistance) is driven by the resistivity of resistive layer 310. Assuming a square resistance (Rsquare) of 30 mOhms and a track width (w) of 75 micrometers, a track length (L) of 1250 micrometers provides a resistive termination of 0.5 Ohms using equation (1) below.

$$R = \text{Rsquare} * L/w \qquad (1)$$

For the higher frequency or AC part of the impedance, microstrip transmission line design formulas (See e.g., Transmission Line Design Handbook by Brian C. Wadell, Artech House 1991) can be used to calculate the required transmission line parameters. In this example, with the parameters above for resistive layer 310 (i.e., square resistance, track length L, and track width w), a permittivity of about 3.9 and a thickness of about 0.2 micrometers for second dielectric layer 308 can be determined to result in a resistance termination of 0.5 Ohms in the Ghz range.

In another embodiment, to achieve a target resistance of 50 Ohms over a range of operating frequencies from D.C. up into the gigahertz range, a configuration may be obtained using the same approach described above. An example configuration may include a resistivity of 10 Ohms/square, a track length (L) of 5.5 micrometers, and a track width (w) of 0.5 um for resistive layer 310 and a permittivity of about 3.9 and a thickness of 3 micrometers for second dielectric layer 308.

The skilled person will readily recognize that, in the above examples, the target value of DC resistance (0.5Ω or 50Ω, respectively) may be obtained using a resistive layer 310 having values of square resistance, track width (w) and track length (L) that are different from those used in the above examples but which still respect equation (1). In a case where the resistive layer 310 has different values of square resistance, track width (w) and track length (L) from the values given in the examples, the parameters of the transmission line (and, in particular, the properties of the second dielectric layer 308) may be adjusted, as required, using microstrip transmission line design formulas, to achieve the desired 0.5Ω or 50Ω impedance up to the Gigahertz range.

Figure 10:
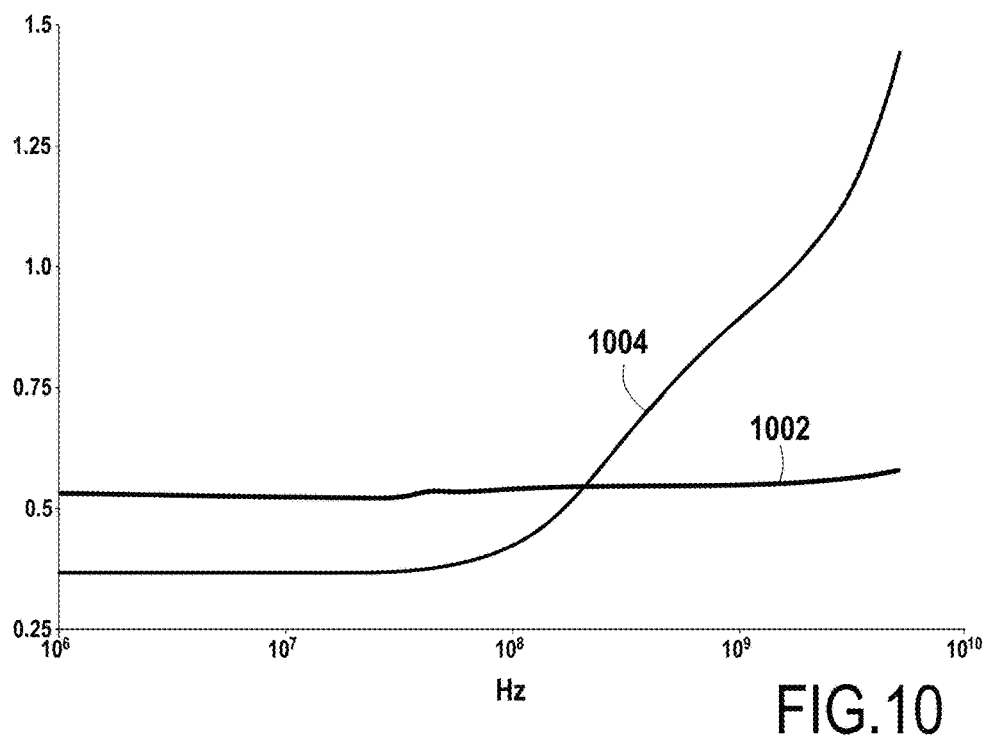
FIG. 10 illustrates the frequency response performance of a resistive element of an RC structure according to an embodiment.

FIG. 10 illustrates the frequency response performance of the resistive element of an example RC structure according to an embodiment. The example RC structure provided a 5 nF vertical capacitor and targeted a resistance of 0.5 Ohms for the resistive element over the frequency band extending from DC to 5 GHz. A microstrip transmission line configuration was used for the resistive element.

As shown by curve 1002 in FIG. 10, the resistive element according to the embodiment has a substantially constant resistance of about 0.5 Ohms over the entire target frequency range. Uniform performance for the device can thus be achieved over the operating frequency range.

In contrast, curve 1004 shows the performance of a resistor with uncontrolled impedance. The resistor with uncontrolled impedance is laid on top of a high ohmic substrate and is not dimensioned as a transmission line. As shown, the uncontrolled impedance starts to increase dramatically at around $10^8$ Hz (100 MHz) and almost doubles in value at about $10^9$ Hz (1 GHz). This results in uneven performance over the operating frequency range for the device.

The foregoing description of the embodiments will so fully reveal the general nature of the disclosure that others can, by applying knowledge within the skill of the art, readily modify and/or adapt the embodiments for various applications, without undue experimentation, without departing from the general concept of the present disclosure. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims.

The invention claimed is:

1. A semiconductor device in a radio frequency power transmitter having a target load resistance, the semiconductor device comprising:
    a low-ohmic substrate;
    a first dielectric layer disposed above the low-ohmic substrate;
    a conductive layer disposed above the first dielectric layer;
    a second dielectric layer disposed above the conductive layer; and
    a resistive layer disposed above the second dielectric layer,
    wherein the low-ohmic substrate, the first dielectric layer and the conductive layer form a vertical capacitor,
    wherein the second dielectric layer and the resistive layer form a resistive element,
    wherein a resistivity of the low-ohmic substrate is configured such that the conductive layer provides a reference ground above a predefined frequency, and
    wherein the second dielectric layer and the resistive layer are configured such that the resistive element is impedance matched, relative to the reference ground, to the target load resistance of the radio frequency power transmitter.

2. The semiconductor device of claim 1, wherein the resistivity of the low-ohmic substrate is lower than or equal to 1 mOhms·cm.

3. The semiconductor device of claim 1, wherein the low-ohmic substrate contains doped material.

4. The semiconductor device of claim 1, wherein a thickness of the low-ohmic substrate is lower or equal to 100 micrometers.

5. The semiconductor device of claim 1, wherein the first dielectric layer is planar or deposited into a trench etched into the low-ohmic substrate.

6. The semiconductor device of claim 1, wherein a thickness of the second dielectric layer is between 0.2 and 0.3 micrometers.

7. The semiconductor device of claim 1, wherein a sheet resistance of the resistive layer is between 10 mOhms per square to 20 Ohms per square.

8. The semiconductor device of claim 1, wherein the resistive layer corresponds to a metallization layer made of titanium, platinum, or copper.

9. The semiconductor device of claim 1, wherein the resistive layer is made of tantalum nitride.

10. The semiconductor device of claim 1, wherein the second dielectric layer and the resistive layer form a microstrip transmission line.

11. The semiconductor device of claim 1, further comprising a first auxiliary ground plane disposed to surround one or more sides of the resistive layer, thereby the second dielectric layer, first auxiliary ground plane and the resistive layer form a coplanar transmission line.

12. The semiconductor device of claim 1, further comprising a first auxiliary ground plane disposed to surround one or more sides of the resistive layer, and a second auxiliary ground plane disposed above the resistive layer, thereby the second dielectric layer, the first and second auxiliary ground planes and the resistive layer form a stripline transmission line.

13. The semiconductor device of claim 1, wherein the vertical capacitor provides a decoupling capacitor and the resistive element provides a broadband damping resistor.

14. The semiconductor device of claim 1, wherein the semiconductor device forms an envelope termination circuit of the radio frequency power transmitter.

15. A method for fabricating a semiconductor device for use in a radio frequency power transmitter having a target load resistance, the method comprising:

providing a low-ohmic substrate;

forming a first dielectric layer above the low-ohmic substrate;

forming a conductive layer above the first dielectric layer;

forming a second dielectric layer above the conductive layer; and forming a resistive layer above the second dielectric layer, wherein the second dielectric layer and the resistive layer form a resistive element, wherein providing the low-ohmic substrate comprises configuring a resistivity of the low-ohmic substrate such that the conductive layer provides a reference ground above a predefined frequency, and wherein forming the second dielectric layer and the resistive layer comprises configuring the second dielectric layer and the resistive layer such that the resistive element is impedance matched, relative to the reference ground, to the target load resistance of the radio frequency power transmitter.

* * * * *